United States Patent [19]
Reppen

[11] Patent Number: 4,673,831
[45] Date of Patent: Jun. 16, 1987

[54] RF POWER SWITCHES

[75] Inventor: Gyora Reppen, Raanana, Israel

[73] Assignee: Tadiran Israel Electronics Industries Ltd., Givat Shmuel, Israel

[21] Appl. No.: 567,386

[22] Filed: Dec. 30, 1983

[30] Foreign Application Priority Data

May 11, 1983 [IL] Israel ......................... 68659

[51] Int. Cl.[4] .................. H01P 1/10; H03H 7/48; H03K 3/33
[52] U.S. Cl. ..................... 307/300; 307/280; 307/253; 307/259; 307/317 R; 455/78
[58] Field of Search ............... 307/239, 248, 253, 256, 307/259, 317 R, 280, 300, 551, 559, 565, 567; 333/103; 455/78

[56] References Cited

U.S. PATENT DOCUMENTS

| | | | |
|---|---|---|---|
| 2,816,238 | 12/1957 | Elliott | 333/103 |
| 3,027,524 | 3/1962 | May, Jr. | 333/103 |
| 3,504,199 | 3/1970 | Cooperman | 307/319 |
| 3,593,205 | 7/1971 | Coraccio et al. | 333/103 |
| 4,056,792 | 11/1977 | Horwitz et al. | 333/31 R |
| 4,492,937 | 1/1985 | Theriault | 333/103 |

Primary Examiner—Stanley D. Miller
Assistant Examiner—Richard Roseen
Attorney, Agent, or Firm—Fleit, Jacobson, Cohn & Price

[57] ABSTRACT

RF switches, for use with radio frequencies, are fast, and require practically no DC energy for maintaining the ON and OFF positions. The switches include a rectifier in series with a capacitor, or with another rectifier in a back-to-back position, or facing each other, or a transistor instead of these two, the rectifier and transistor having an adequate reverse recovery time, these elements being arranged between the RF power source and the load. An inductive element is disposed in series with either the elements of the switch or between the base of the transistor and ground. There may be provided a further diode in series with the inductive element and the switch and in the connection to ground.

11 Claims, 10 Drawing Figures

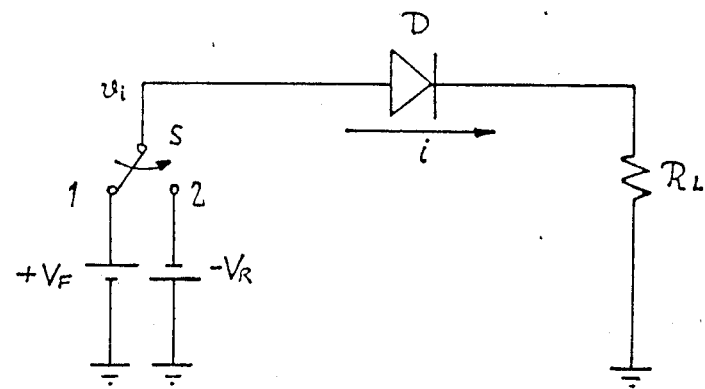
FIG. 1
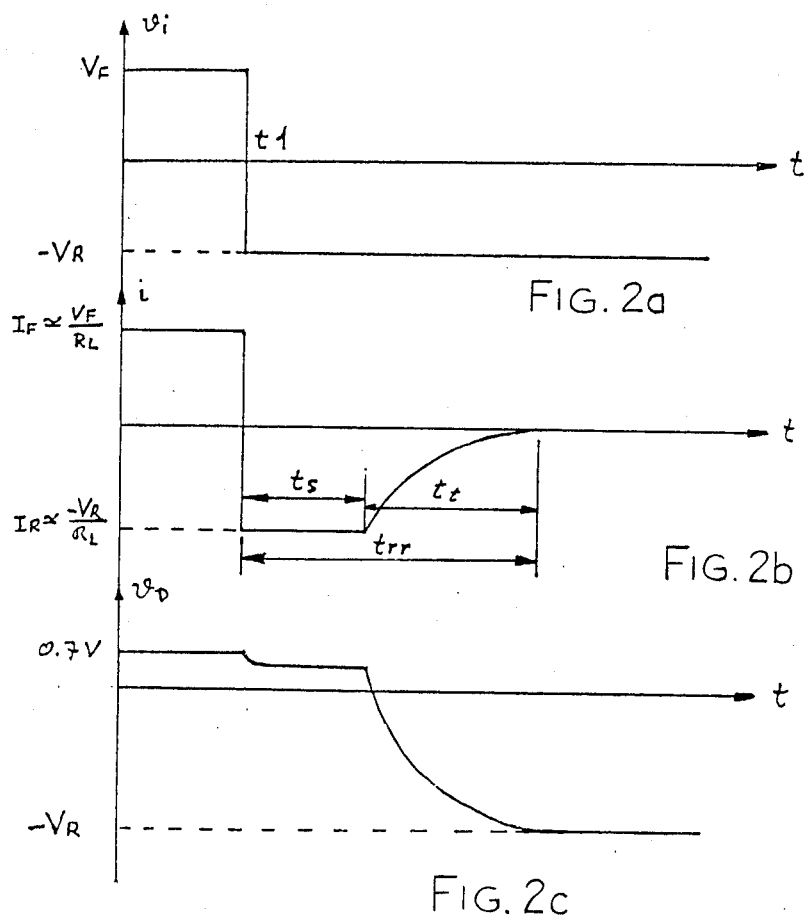
FIG. 2a
FIG. 2b
FIG. 2c

4,673,831

RF POWER SWITCHES

FIELD OF THE INVENTION

The invention relates to RF Power Switches, for use with radio frequencies. The novel switches are fast, can be used with high power and practically no DC energy is required to maintain the switch in either of its two states, "ON" or "OFF". The novel switches are of special value for manpack devices where the specific properties of the novel switches eliminate the requirement to provide cumbersome DC sources for switching purposes.

BACKGROUND OF THE INVENTION

There exists a multitude of RF switches. Amongst the more advantageous ones, there may be mentioned RF switches based on PIN diodes, which are capable of switching high power RF with acceptable insertion losses. One of the more serious drawbacks of such switches is the necessity to provide a constant DC current. Such energy requirements are meaningful with certain types of equipment, such as manpack devices where the power sources are limited and where such PIN switches require a special DC source adapted to provide the required switching energy. Attempts have been made to overcome this drawback and to eliminate the necessity to provide DC current for the switching.

The drawbacks of the existing HF switches have been overcome to a large extent by the novel switches of the present invention, which are based on readily available inexpensive components, which are simple in construction and which give highly satisfactory results.

SUMMARY OF THE INVENTION

There are provided fast high power radio frequency signal switches which can handle high power and which require very little energy for maintaining the switch in either of its positions, and also for the switching. The novel RF switches comprise conventional readily available inexpensive components. The switches are based on the combination of at least one rectifier (diode) in combination with either a capacitor or another rectifier (diode), arranged "back to back" with the first diode. A suitable transistor can be used instead of the two diodes.

The novel switches have a wide applicability in electronic circuits, and amongst others in band pass filters, antenna matching networks, and for switching between transmitters. The novel switches make use of the phenomenon of reverse recovery time trr of rectifiers, such as diodes, which enable diodes to conduct in the "ON" state of the switch in both directions with minimum loss and distortion of the RF signal. In the "OFF" state the diode or diodes is or are reverse biased and the isolation afforded by the switch depends on diode capacitance. The choice of suitable diodes, having a comparatively long reverse recovery time and in particular a long storage time $t_s$, and a small capacitance, makes it possible to provide RF switches with the required performance. As mentioned above, the novel switches make use of the parameter "reverse recovery time", "trr", of rectifiers. The parameter is illustrated with reference to the parameter of diodes, and can be defined with reference to the circuit of FIG. 1, and time diagrams of FIG. 2.

As shown in FIG. 1, the circuit comprises a diode D in series with resistor $R_L$, powered by the power source $+V_F$ and $-V_R$, via switch S which can be changed from position 1 to position 2. The various timing parameters of the circuit of FIG. 1 are set out in FIG. 2.

When the switch is in the 1-position there flows through the diode D a current $I_F$, and assuming that the resistance of the diode is much smaller than $R_L$, the current $I_F$ is $$I_F = V/R_L.$$

When the switch S is changed to the 2-position at time $t_1$, the diode current and the voltage across the diode $V_D$ change as set out in FIG. 2c. During the period of time $t_s$ (storage time) there flows through the diode a reverse current $I_R$ which is equal to the current $I_F$, after this time $t_s$ the diode starts to shut down, and the current through it decreases exponentially during the period of time $t_t$ (transition time). The sum of $t_s$ and $t_t$ being the time trr (reverse recovery time). Around the period of time $t_1$ the diode behaves very much like a resistor by the means of the direction of flow of the current depending on the direction of voltage source in the circuit, see FIG. 2(a). For periods of time $t_s$ of adequate duration it is possible to pass via the diode D a high-frequency signal without the diode passing to reverse voltage and cutoff. As shown above, at time $t_1$ the input voltage is reversed to $v = -V_R$, and since the PN junction is charged with a very large number of minority carriers, the diode current will not fall immediately to zero, until the recombination of the minority carriers is complete. Until such time the diode will continue to conduct, the current depending on the external resistance $R_L$, where $i = -V_R/R_L$. As shown in FIG. 2(c) the voltage across the diode during reverse current conduction is slightly lower than the forward bias voltage, which is typically 0.7 V, as shown in the Figure.

BRIEF DESCRIPTION OF THE DRAWINGS

The invention and its physical principles are illustrated with reference to the enclosed schematical drawings, in which:

FIG. 1 is a circuit used for illustrating the parameter trr of diodes and the like;

FIG. 2 is a graphic presentation illustrating the parameter trr;

DESCRIPTION OF PREFERRED EMBODIMENTS

Figure 3:
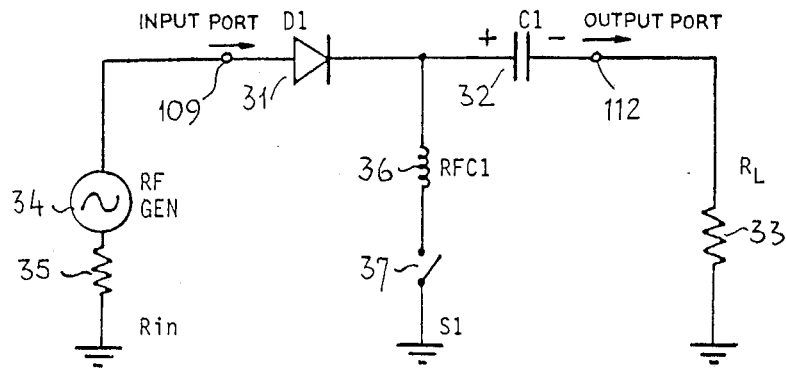
FIG. 3 is a circuit of an RF switch based on a diode and a capacitor.

As shown in FIG. 3, the one-diode one-capacitor power switch comprises a diode 31 having its anode coupled to input port 109, in series with capacitor 32, the output port 112, and the load 33 (resistor $R_1$), there being provided an RF generator 34 with its internal resistance $R_1$ being designated as 35, and there being provided between diode 31 and capacitor 32 a connection to ground via RF choke 36 and switching means 37. This circuit is shown with switch 37, (which can be a bipolar or a FET transistor) in "OFF" position, and thus the entire circuit (switch) is in the "OFF" position. The capacitor 32 is charged to the peak voltage of the voltage source, at the polarity shown, while the diode 31 is reverse biased and signal passage is prevented.

When the switch 37 is closed, current flows in the positive half cycle through the diode 31, RF choke 36 and switch 37. At the same time, the capacitator 32 starts to discharge through the RF choke 36 and switch 37. Diode 31, which has conducted forwards, is capable of conducting backwards, due to the trr phenomenon. After a sufficient number of cycles, the diode 31 will fully conduct while the RF choke 36 shorts to ground any DC voltage which is developed on the capacitor 32, due to differences in the charges which flow in the diode 31 forwards and backwards. The conductance of the switch is directly dependent on the diode parameter trr defined above. A diode with trr=zero cannot conduct backwards and the signal on the load via the output port will be very much distorted when diodes with increasing trr are chosen such diodes conduct backwards and for an adequate storage time $t_s$ ($t_s$ T/2) the switch is in full "ON" state. The isolation provided by this switching circuit is as follows: assuming that the diode breakdown is sufficiently high and that leakage current is sufficiently small, the isolation of the switching circuit is: Isolation (db)=20 log $RL\omega CJO$.

The diode 31 conducts the full wave, and the diode must be chosen so that the diode storage time $t_s$ is longer than half the cycle period. The smaller the diode capacitance CJO, the higher will be the isolation between the RF generator 34 and the load 33.

Representative values of a switching circuit according to FIG. 3 are:
$D_1$=ESM 100 of Thomson CSF
$C_1$=68 $\beta$nF
$RFC_1$=330 $\mu$H
A SPICE computer program was run and computed the "ON" state insertion loss and harmonic distortion at several fequencies. The parameter trr is represented in the SPICE diode model by the parameter TT. The results are shown in Table 1:

TABLE 1

| Maximum harmonic distortions (db) | | | Insertion losses (db) | | | |
|---|---|---|---|---|---|---|
| 30 MHz | 10 MHz | 2 MHz | 30 MHz | 10 MHz | 2 MHz | TT($\mu$sec) |
| H2 = −31 | H3 = −24 | H2 = −14 | 0.04 | 0.2 | −1.2 | 0.3 |
| H3 = −32 | H3 = −25 | H3 = −16 | | | | |
| H2 = −84 | H2 = −78 | H2 = −21 | 0 | 0 | 0.35 | 1 |
| H3 < H2 | H3 < H2 | H3 = −22 | | | | |
| | H2 = −90 | H2 = −27 | 0 | 0 | 0.13 | 3 |
| | H3 < H2 | H3 = −27 | | | | |
| | | H2 = −34 | 0 | 0 | 0.05 | 5 |
| | | H3 = −34 | | | | |
| | | H2 = −72 | 0 | 0 | 0.015 | 10 |
| | | H3 = −76 | | | | |

The "OFF" state was examined when a positive voltage of 110 V was applied to the cathode of the diode. There was examined the isolation between the RF source of 100 V and the load. The results of the isolation tests are as set out in Table 2:

TABLE 2

| Isolation (db) | | | |
|---|---|---|---|
| 30 MHz | 10 MHz | 2 MHz | CJO |
| −46 | −56 | −71 | 5 PF |
| −40 | −50 | −65 | 10 PF |
| −34 | −44 | −59 | 20 PF |
| −30 | −40 | −55 | 30 PF |

Figure 4:
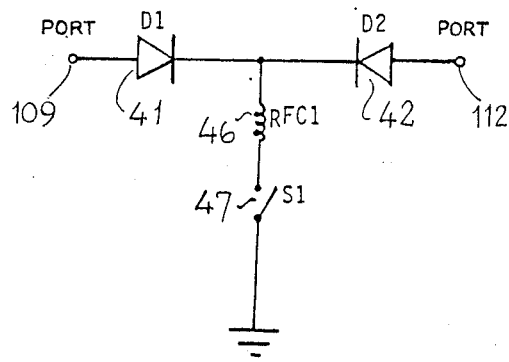
FIG. 4 is a circuit of an RF switch based on two back-to-back diodes.

As shown in FIG. 4, a two-dioide RF switch comprises in combination two diodes 41 and 42, back to back. An RF generator with internal resistance $R_{in}$ (not shown) is coupled to input port 109 and output port 112 is coupled to load $R_L$ (not shown) all in series with diodes 41 and 42. There is provided between diodes 41 and 41, an RF choke 46 and switching means 47, which can be a FET transistor. This circuit has an improved performance as compared with that of FIG. 3: the diode 42 replacing the capacitor 32 of the preceding circuit. The RF switch is in the OFF state when switching means 47 is open. In this state the diodes 41 and 42 which are in series in back-to-back configuration, cannot conduct since one of them is always reverse biased. The isolation of the switch is 20 log RL $\omega$CJO/2. When the switching means 47 is closed, diode 41 conducts in a forward direction in the positive half period of the cycle, and hence is also able to conduct backwards. In the negative half period of the cycle diode 42 conducts forwards and diode 41 conducts backwards, and thus the switching circuit will from this period of time be in the "ON" position while the RF choke 46 current compensates for the differences in loss in the diodes when these conduct forwards and backwards.

The circuit was run on a SPICE computer program where $R_{in}=R_L-50$ ohm and the following results were obtained for "ON" and "OFF" states; as shown in Table 3:

TABLE 3

| Maximum thermionic distortions (db) | | | Insertion losses (db) | | | ON position |
|---|---|---|---|---|---|---|
| 30 MHz | 10 MHz | 2 MHz | 30 MHz | 10 MHz | 2 MHz | TT($\mu$sec) |
| H2 = −100 | H2 = −55 | 2H = −45 | 0 | 0.01 | 1.3 | 1 |
| H3 = −79 | H3 = −33 | H3 = −12 | | | | |
| | H2 = −91 | H2 = −53 | | | 0.35 | 3 |
| | H3 = −80 | H3 = −19 | 0 | 0 | | |
| | H2 = −86 | H2 = −70 | | | 0.14 | 5 |

TABLE 3-continued

| Maximum thermionic distortions (db) | | | Insertion losses (db) | | | ON position |
|---|---|---|---|---|---|---|
| 30 MHz | 10 MHz | 2 MHz | 30 MHz | 10 MHz | 2 MHz | TT($\mu$sec) |
| | H3 = −86 | H3 = −24 | 0 | 0 | | |
| | H2 = −98 | H2 = −54 | | | | |
| | H3 = −95 | H3 = −26 | 0 | 0 | 0.1 | 10 |

In the "OFF" state for 2 MHz the following results were obtained (Table 4):

TABLE 4

| Isolation (db) | CJ0 |
|---|---|
| −66 | 5 PF |
| −59 | 10 PF |
| −53 | 20 PF |
| −49 | 30 PF |

The theoretical isolation of the circuit was examined when a positive DC voltage of 110 V was applied to the cathodes of diodes 41 and 42 in the circuit of FIG. 4, the diodes D1 and D2 being thomson CSF ESM 100, with $R_L$=50 ohms, as shown in Table 5 below:

TABLE 5

| Isolation (db) | | | CJ0(PF) |
|---|---|---|---|
| 30 MHz | 10 MHz | 2 MHz | |
| −54 | −64 | −78 | 5 |
| −48 | −58 | −72 | 10 |
| −42 | −52 | −66 | 20 |
| −39 | −48 | −62 | 30 |

Instead of the two diodes 41 and 42 there may be used a suitable transistor, the base of which is connected to the RF choke 46, the collector and emitter being connected with the load and the RF source, respectively. The condition is that the length of the trr of the transistor be adequate for the intended purpose. Instead of the RF choke any other suitable inductive element, such as gyrator, may be used. The switching means 47 can be a bipolar transistor a FET transistor, or a thyristor with an adequate trr.

Figure 5:
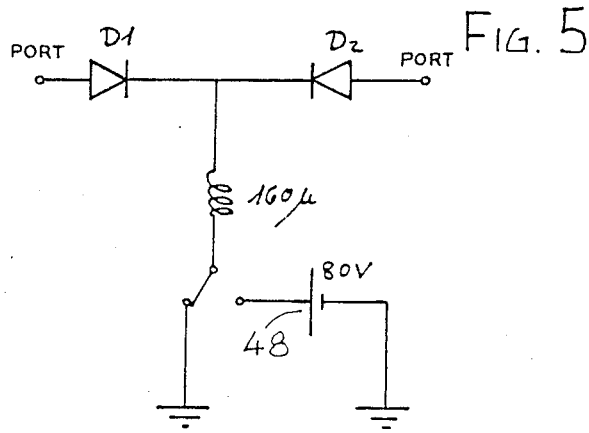
FIG. 5 is a circuit similar to FIG. 4 with means for applying a DC potential to the cathodes of the diodes in OFF position.

The circuit of FIG. 5 comprises two ESM 100 diodes of Thomson CSF connected in series, back to back, having the following values: CJO=23 PF; $t_s$=1.5 $\mu$sec; $t_f$=0.5 $\mu$sec with 80 V DC source as shown, the other components being as shown in FIG. 4 gave the following results (Table 6):

same. Not illustrated is an RF generator and an internal resistance coupled to the left-hand port and a, load coupled to the right-hand port. Coupled thereto is RF₁ choke 68 with switch 69, RF₂ choke 70, and switch 71 connected as shown. When the switches 69 and 71 are open, capacitors 62 and 64 are charged to peak voltage of the generator 65 and the two diodes 61 and 63 which are reverse biased are blocked.

The isolation of the switch will be:

Isolation $(db) =$ $$20 \text{ Log } \frac{RL}{RL + 1/2\omega CJ0} \text{ where } C_1 = C_2 >> CJ0.$$

for $RL << \frac{1}{2\omega CJ0}$ the isolation is 20 log 2 RL CJ0

Figure 7:
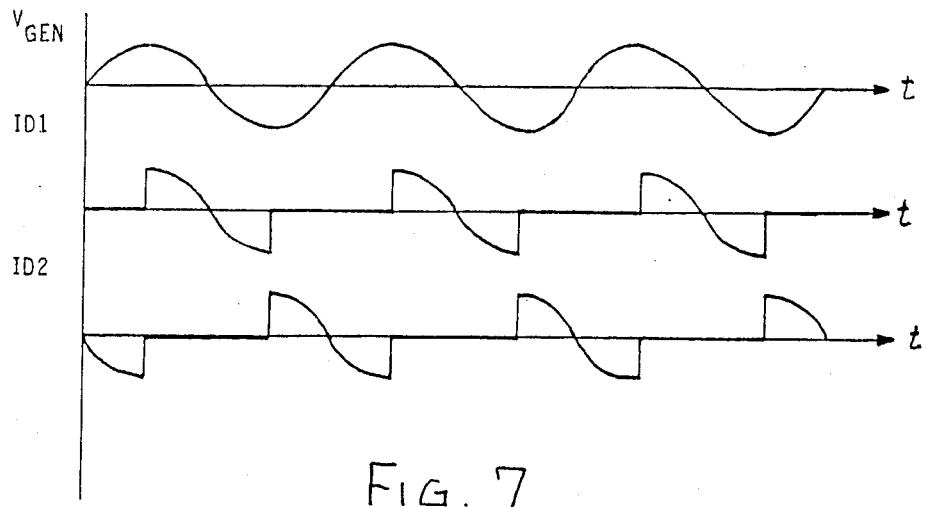
FIG. 7 is a graphic presentation of generator and load voltages and the current in the two diodes of the circuit of FIG. 6 in the ON state.

For turning on the power switch, both switches 69 and 71 are closed, and thus the diode cathodes are DC grounded and the diodes start conducting in both directions, due to their ability to conduct in the reverse direction during the reverse recovery time trr. The current through the diodes during "ON" state and the generator and load voltages are shown in FIG. 7. The two diodes conduct alternatively, each of them conducting forwards for a quarter of the cycle. The diode storage $t_s$ ought to be longer than a quarter of the cycle period. The switching time depends on the capacitance of 62 and 64. In order to attain fast switching, the switching time of 69 and 71 must be very short and in order not to affect total switching time fast transistors are advantageously used for 69 and 71.

The computer run with trr represented by TT in the SPICE program, with an RF source of 100 V and 50 ohms internal resistance, and 50 ohms load, gave the following results:

TABLE 7

ON State

Maximum harmonic

TABLE 6

| PARAMETER | | 2 MHz | 4 MHz | 8 MHz | 16 MHz | 30 MHz |
|---|---|---|---|---|---|---|
| HARMONICS | E (2) | −40 | −40 | −40 | −40 | −56 |
| (db) | E (3) | −26 | −26 | −24 | −46 | −40 |
| TWO TONE INTERMODULATION (db) | | −50 | −45 | −42 | <−35 | <−32 |
| SWITCHING | ON-OFF | 8 | 8 | 6 | 4.5 | 7 |
| TIME ($\mu$Sec) | OFF-ON | 1 | 0.8 | 0.5 | 0.5 | 0.5 |
| ISOLATION (db) | | −61 | −55 | −45 | −41 | −36 |
| INSERTION LOSS (db) | | 0.04 | 0.01 | 0.13 | 0.3 | 0.5 |
| VSWR at 50 ohm | | 1.14 | 1.11 | 1.11 | 1.13 | 1.16 |

FIG. 5: The circuit shown in FIG. 5 is in the "ON" position. When this is switched to "OFF", a DC voltage from voltage source 48, of about 80 V is applied to the cathodes of the two diodes 41 and 42. This blocks the diodes, thus providing a more speedy switching and a better isolation.

Figure 6:
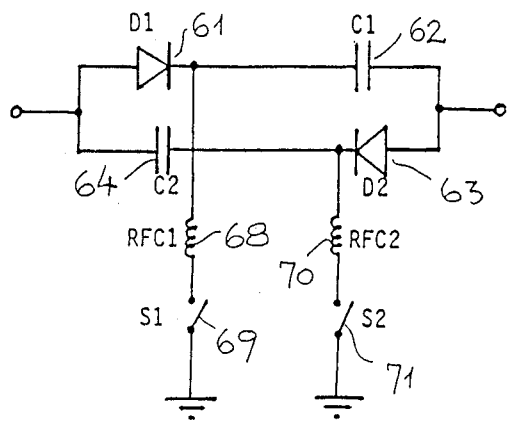
FIG. 6 is a circuit of an RF switch comprising two arrangements of diode-and capacitor in parallel.

FIG. 6: illustrates a "two-diodes-in-parallel" RF power switch. This comprises diode 61 and capacitor 62 in series, with diode 63 and capacitor 64 parallel to

| distortions (db) | | Insertion/Losses (db) | | |
|---|---|---|---|---|
| 10 MHz | 2 MHz | 10 MHz | 2 MHz | TT($\mu$sec) |
| H3 = −24 | H3 = −23 | 1.6 | 1.7 | 0 |
| H5 = −29 | H5 = −28 | | | |
| H3 = −46 | H3 = −31 | 0 | 0.2 | 0.3 |
| H5 = −51 | H5 = −36 | | | |
| H3 = −80 | H3 = −42 | 0 | 0.03 | 1 |
| | H5 = −47 | | | |
| | H2 = −66 | 0 | 0.03 | 2 |

TABLE 7-continued

| ON State | | | | |
|---|---|---|---|---|
| Maximum harmonic distortions (db) | | Insertion/Losses (db) | | |
| 10 MHz | 2 MHz | 10 MHz | 2 MHz | TT(μsec) |
| H3 < H2 | | | | |

"OFF" state was examined when a 110 V DC was applied to the cathode of the diodes. The isolation was examined between the RF source of 100 V and the load.

TABLE 8

| ISOLATION (db) | | | |
|---|---|---|---|
| 30 MHz | 10 MHz | 2 MHz | CJO |
| −39 | −48 | −67 | 5 PF |
| −33 | −42 | −59 | 10 PF |
| −27 | −36 | −52 | 20 PF |
| −23 | −33 | −48 | 30 PF |

The switching time of the RF switches of the invention from "ON" to "OFF" state depends on how fast the charge can be removed from the diode junctions. This can be accelerated by applying a high DC voltage to the cathodes of the diodes. Typical switching times are of the order of a few micro-seconds. Switching from "OFF" to "ON" is fast and depends on the forward recovery time $t_{fr}$ of the diodes which is generally shorter than 1 micro-second.

Figure 8:
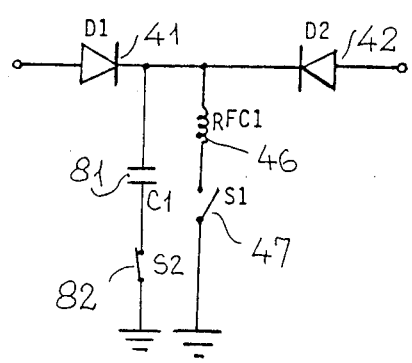
FIG. 8 is a circuit of an RF switch similar to that of FIG. 4, with added capacitor and switching means between the two diodes and ground.

Another embodiment of a switch according to the present invention is illustrated with reference to FIG. 8, the arrangement of which is similar to that of FIG. 4, there being, provided a capacitor 81 in series with switching means 82 arranged in parallel with the RF choke 46 and the switching means 47. The additional switching means 82 can be a MOS-FET transistor or the like. The arrangement is such that when switch 47 is open, switch 82 is closed, and vice-versa. When the switch 47 is open, and switch 82 is closed, the entire RF switch will be in the "OFF" position, whereas when switch 47 is closed and switch 82 is open, the RF switch is in the "ON" position and current will flow from the generator 44 to the load 43. The provision of the two additional elements 81 and 82 improves the isolation and reduces the speed of switching, a pronounced advantage is the elimination of the need of the DC source which is illustrated with reference to FIG. 5. The capacitor 81 is charged in "OFF" of the switch to the peak value of the RF generator 44 and thus the two diodes 41 and 42 are maintained in a reversed biased state. Any RF leakage through diode 41 will be shorted to the ground via capacitor 81 and switching means 82.

TABLE 9

| PARAMETER | | 2 MHz | 4 MHz | 8 MHz | 16 MHz | |
|---|---|---|---|---|---|---|
| HARMONICS (db) | E (2) | −50 | −50 | −50 | −60 | −50 |
| | E (3) | −25 | −28 | −30 | −40 | −40 |
| Switching | ON−OFF | <1 | <1 | <1 | <1 | <1 |
| time (μsec) | OFF−ON | <1 | <1 | <1 | <1 | <1 |
| Isolation (db) | | −79 | −79 | −75 | −71 | −53 |
| Insertion Loss (db) | | 0.13 | 0.11 | 0.19 | 0.16 | 0.47 |
| VSWR at @50 ohm | | 1.15 | 1.11 | 1.08 | 1.11 | 1.2 |

Figure 9:
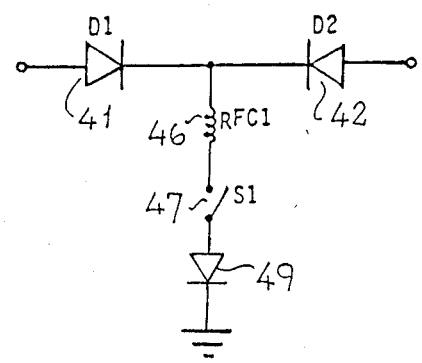
FIGS. 9 and 10 show modifications of the circuits of FIGS. 3 and 4, respectively.

As shown in FIG. 9, it is advantageous to add a diode 49 in series with the RF choke 46 and switch 47. Suitable diodes are of the 1N5711, 1N914 or similar type.

The device shown in FIG. 4 can also be constructed with anodes of diodes 41 and 42 facing each other. If such a device is provided with a diode 49 as illustrated in FIG. 9, such additional diode will be arranged in the opposite direction.

Figure 10:
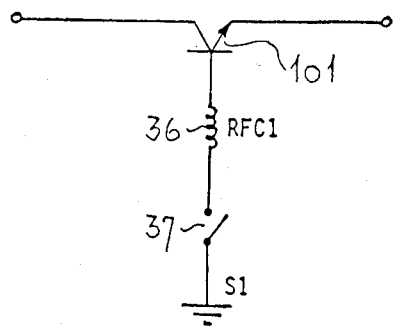

As shown in FIG. 10, instead of the diodes 31 and 32 of FIG. 3, there can be provided a slow transistor 101, the performance being essentially the same as in FIG. 3.

The above description is by way of illustration only, and it is clear that the invention includes various modifications and changes in the nature and arrangement of parts. The invention relates in general terms to RF switches based on the combination of rectifying means and capacitance or back-to-back rectifying means, the combination of diodes with either a capacitor or with a back-to-back RF generator being illustrative only. The invention is based on the utilization of the reverse current $I_R$ which flows during the period of time termed "reverse recovery time", trr, which is a combination of the storage time $t_s$ and the transition time $t_t$ ($t_s + t_t =$ trr), via a rectifier such as a RF generator.

I claim:

1. An RF switch for high power radio frequency signals having negative and positive voltages swings consisting of a rectifier means in series with a capacitor, or two rectifiers in a back-to-back arrangement, coupled between an input and an output, each said rectifier having predetermined reverse characteristics, so that the reverse characteristics of the rectifier comprises a storage time $t_s$ which is of a duration during which a reverse current, caused by the negative voltage swing of the radio frequency signal, flows through the rectifier, a prolonged duration of $t_s$ resulting in an improved performance of a switch ON characteristic, said input receiving said radio frequency signals; and a control switch serially connected to an inductive element, one side of said inductive element opposite said control switch connected between said capacitor and rectifier, or between the two rectifiers, and one side of said control switch opposite said inductive element connected to a common ground between signals at the input and output, the changing of said control switch from "OFF" to "ON" switching the RF switch from "OFF" to "ON" whereby no external bias voltage or power source is necessary.

2. An RF switch according to claim 1, wherein a diode is said rectifier that is in series with said capacitor or said two rectifiers is a pair of diodes in a back-to-back relationship, an RF generator is coupled to said input and a load is coupled to said output, said inductive element being an RF choke, a coil or an inductor, coupled in series with said control switch, and said inductive element is coupled intermediate said control switch and the junction between said diode and said capacitor or the junction between said pair of diodes.

3. An RF switch according to claim 1, wherein the control switch is a bipolar transistor, an FET transistor or a thyristor.

4. An RF switch according to claim 2, wherein means are provided for applying a DC voltage to a respective cathode in each diode of said pair of diodes when the RF switch is in the "OFF" position.

5. An RF switch according to claim 4, wherein the DC voltage applied is higher than a peak value of the high power radio frequency signals.

6. An RF switch according to claim 2, wherein there is provided in parallel with the RF choke and the control switch, a further capacitor and another control switch coupled such that one of the control switches is open while the other is closed.

7. An RF switch for high power radio frequency signals having negative and positive voltage swings comprising two parallel elements connected between an input and an output, each element consisting of a diode and a capacitor in series, there being provided between the diode and the capacitor of each of these elements a connection to a common ground between signals at the input and output via a respective inductive element and a respective control switch and wherein the reverse characteristics of each diode comprises a storage time $t_s$ which is of a duration during which a reverse current, caused by the negative voltage swing of the radio frequency signal, flows through a respective diode, a prolonged duration of $t_s$ resulting in an improved performance of a switch ON characteristic, the changing of said control switches from "OFF" to "ON" switching the RF switch from "OFF" to "ON" whereby no external bias voltage or power source is necessary.

8. An RF switch according to claim 3, wherein a further diode is provided in series with the inductor and the control switch in the connection to ground.

9. An RF switch for higher power radio frequency signals, having negative and positive voltage swings, consisting of a transistor having an emitter as an input and a collector as an output, said transistor having a predetermined reverse characteristic, the reverse characteristics of the transistor being such that a storage time $t_s$ which is of a duration during which a reverse current, caused by the negative voltage swing of the radio frequency signal, flows through the transistor, a prolonged duration of $t_s$ resulting in an improved performance of a switch ON characteristic, said input receiving said radio frequency signals; and a control switch in series with an inductive element, one side of said inductive element opposite said control switch connected to a base of the transistor and one side of said control switch opposite said inductive element being connected to a common ground between signals at the input and output, the changing of said control switch from "OFF" to "ON" switching the RF switch from "OFF" to "ON" whereby no external bias voltage or power source is necessary.

10. A switch according to claim 9, wherein the control switch is a bipolar transistor, an FET transistor or a thyristor.

11. An RF switch according to claim 9, wherein said inductive element is an RF choke, coil, or inductor and wherein said inductive element is intermediate said control switch and said base, said control switch being one of an FET transistor, a bipolar transistor or a thyristor having its base connected to ground.

* * * * *